(12) United States Patent
Shende et al.

(10) Patent No.: US 12,107,603 B1
(45) Date of Patent: Oct. 1, 2024

(54) ADAPTIVE READ RECOVERY FOR NAND FLASH MEMORY DEVICES

(71) Applicant: Marvell Asia Pte Ltd, Singapore (SG)

(72) Inventors: Nirmal Shende, Santa Clara, CA (US); Nedeljko Varnica, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 38 days.

(21) Appl. No.: 18/049,771

(22) Filed: Oct. 26, 2022

Related U.S. Application Data

(60) Provisional application No. 63/272,148, filed on Oct. 26, 2021.

(51) Int. Cl.
| | | |
|---|---|---|
| *H03M 13/11* | (2006.01) | |
| *G06N 3/04* | (2023.01) | |
| *G06F 11/10* | (2006.01) | |
| *G06N 3/02* | (2006.01) | |
| *G06N 20/00* | (2019.01) | |
| *H03M 13/29* | (2006.01) | |
| *H03M 13/37* | (2006.01) | |
| *H03M 13/39* | (2006.01) | |
| *H03M 13/45* | (2006.01) | |
| *H04L 1/00* | (2006.01) | |

(52) U.S. Cl.
CPC .......... *H03M 13/1108* (2013.01); *G06N 3/04* (2013.01); *H03M 13/1125* (2013.01); *G06F 11/1068* (2013.01); *G06N 3/02* (2013.01); *G06N 20/00* (2019.01); *H03M 13/1105* (2013.01); *H03M 13/2948* (2013.01); *H03M 13/3707* (2013.01); *H03M 13/3746* (2013.01); *H03M 13/3927* (2013.01); *H03M 13/458* (2013.01); *H04L 1/005* (2013.01)

(58) Field of Classification Search
CPC .......... H03M 13/1108; H03M 13/1105; H03M 13/3707; H03M 13/458; H03M 13/1125; H03M 13/3927; H03M 13/3746; H03M 13/2948; G06N 3/04; G06N 20/00; G06N 3/08; G06N 3/02; H04L 1/005; G06F 11/1068

See application file for complete search history.

(56) References Cited

U.S. PATENT DOCUMENTS

| | | | | |
|---|---|---|---|---|
| 2017/0288699 A1* | 10/2017 | Yang | ............ | H03M 13/3715 |
| 2018/0159560 A1* | 6/2018 | Sharon | ............ | H03M 13/2906 |
| 2019/0340069 A1* | 11/2019 | Kumar | ............ | H03M 13/3707 |
| 2021/0314004 A1* | 10/2021 | Kim | ............ | H03M 13/1111 |

* cited by examiner

*Primary Examiner* — April Y Blair
*Assistant Examiner* — Sazzad Hossain

(57) ABSTRACT

A method of reading data read from a NAND Flash memory device includes decoding a set of data read from the device, using an initial set of hard bit thresholds, when the decoding is unsuccessful, performing a read-retry operation that retries the decoding using, in order, each of a plurality of entries in a read-retry table of hard bit thresholds, stopping when decoding based on one of the entries is successful, and when the read-retry operation is unsuccessful, performing a deep retry operation using a set of log-likelihood ratios (LLRs) that vary in at least one of values or symmetries. NAND Flash memory apparatus includes a Flash media controller, a data bus, and an adaptive LLR engine configured to generate, for use in a deep retry operation, a set of LLRs that, and to transfer the set of LLRs that vary to the media controller via the bus.

22 Claims, 10 Drawing Sheets

ADAPTIVE READ RECOVERY FOR NAND FLASH MEMORY DEVICES

CROSS REFERENCE TO RELATED APPLICATION

This disclosure claims the benefit of copending, commonly-assigned U.S. Provisional Patent Application No. 63/272,148, filed Oct. 26, 2021, which is hereby incorporated by reference herein in its entirety.

FIELD OF USE

This disclosure relates to improving read retry operations in NAND Flash memory devices. More particularly, this disclosure relates to adaptively generating log-likelihood ratio (LLR) entries, based on soft information, for use in a deep retry operation on NAND Flash memory devices.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Typically, data is read from NAND Flash memory using a read reference threshold voltage which may or may not have the proper value, possibly leading to decoding failure. Such a failure invokes a read retry process.

In the read retry process, a new read reference threshold voltage is tried based on a read retry table (RRT) provided by the NAND manufacturer. If decoding continues to fail even after all of the entries in the RRT are tried, a deep retry operation utilizing soft information is invoked.

SUMMARY

In accordance with implementations of the subject matter of this disclosure, a method of reading data read from a NAND Flash memory device includes decoding a set of data read from the NAND Flash memory device, using an initial set of hard bit thresholds, when the decoding is unsuccessful, performing a read-retry operation that retries the decoding using, in order, each of a plurality of entries in a read-retry table of hard bit thresholds, stopping when decoding based on one of the entries is successful, and when the read-retry operation is unsuccessful, performing a deep retry operation using a set of log-likelihood ratios (LLRs) that vary in at least one of (a) values, and (b) symmetries.

In a first implementation of such a method, the set of LLRs that vary may be derived from a predetermined table.

A first aspect of that first implementation, may further include, when the set of LLRs that vary derived from the predetermined table has been exhausted without achieving successful reading, adaptively generating additional LLR values using an adaptive generation technique.

A second implementation of such a method may include generating the set of LLRs that vary using a first adaptive generation technique.

According to a first aspect of that second implementation, the first adaptive generation technique may be a linear regression process.

According to a second aspect of that second implementation, the first adaptive generation technique may a machine learning technique.

In an instance of that second aspect, the first adaptive generation technique may be performed using a neural network.

A third aspect of that second implementation may further include, when the adaptively generated set of LLRs that vary has been exhausted without achieving successful reading, adaptively generating additional LLR values using a second adaptive generation technique.

According to a fourth aspect of that second implementation, the generating the set of LLRs that vary may be based on a plurality of preoptimized constants.

According to a fifth aspect of that second implementation, the generating the set of LLRs that vary may be based on an initial and final syndrome weight.

According to a sixth aspect of that second implementation, the generating the set of LLRs that vary may be based on 0-to-1 flips and 1-to-0 flips made by a hard decoder.

A seventh aspect of that second implementation, may further include, when the adaptively generated set of LLRs that vary has been exhausted without achieving successful reading, performing the deep retry operation using LLR values derived from a predetermined table.

An eighth aspect of that second implementation may further include, when the adaptively generated set of LLRs that vary has been exhausted without achieving successful reading, but decoding performance has improved, adaptively generating additional LLR values using a second adaptive generation technique.

In an instance of that eighth aspect, the improvement in performance is determined based on a value of an output syndrome weight.

A ninth aspect of that second implementation may further include, when the adaptively generated set of LLRs that vary has been exhausted without achieving successful reading, adaptively generating additional LLR values using a second adaptive generation technique, wherein generating additional LLR values is limited to a predetermined number of additional LLR values.

In accordance with implementations of the subject matter of this disclosure, a NAND Flash memory apparatus includes a Flash media controller, a data bus, and an adaptive LLR engine circuit configured to generate, for use in a deep retry operation, a set of LLRs that vary in at least one of (a) values, and (b) symmetries, and to transfer the set of LLRs that vary to the media controller via the data bus.

In a first implementation of such a NAND Flash memory apparatus, the adaptive LLR engine circuit may be embedded within the Flash media controller.

A second implementation of such a NAND Flash memory apparatus may further include a static random access memory (SRAMI), and at least one central processing unit (CPU). The SRAM may be configured to transfer a firmware script to the at least one CPU via the data bus, and the at least one CPU may be configured to run the firmware script to generate the set of LLRs that vary, and to transfer the set of LLRs that vary to the Flash media controller via the data bus.

A third implementation of such a NAND Flash memory apparatus may further include a dynamic random access memory (DRAM), and at least one central processing unit (CPU). The DRAM may be configured to transfer a firmware script to the at least one CPU via the data bus, and the at least one CPU may be configured to run the firmware script to generate the set of LLRs that vary, and to transfer the set of LLRs that vary to the Flash media controller via the data bus.

A fourth implementation of such a NAND Flash memory apparatus may further include at least one of a static random access memory (SRAM) and a dynamic random access memory (DRAM), and at least one of a microprocessor and a microcontroller. The at least one of SRAM and DRAM may be configured to transfer a firmware script to the at least one of the microprocessor and the microcontroller via the data bus, and the at least one of the microprocessor and the microcontroller may be configured to run the firmware script to generate the set of LLRs that vary, and to transfer the set of LLRs that vary to the Flash media controller via the data bus.

In a fifth implementation of such a NAND Flash memory apparatus, the adaptive LLR engine circuit may include linear regression circuitry.

In a sixth implementation of such a NAND Flash memory apparatus, the adaptive LLR engine circuit may include a neural network.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
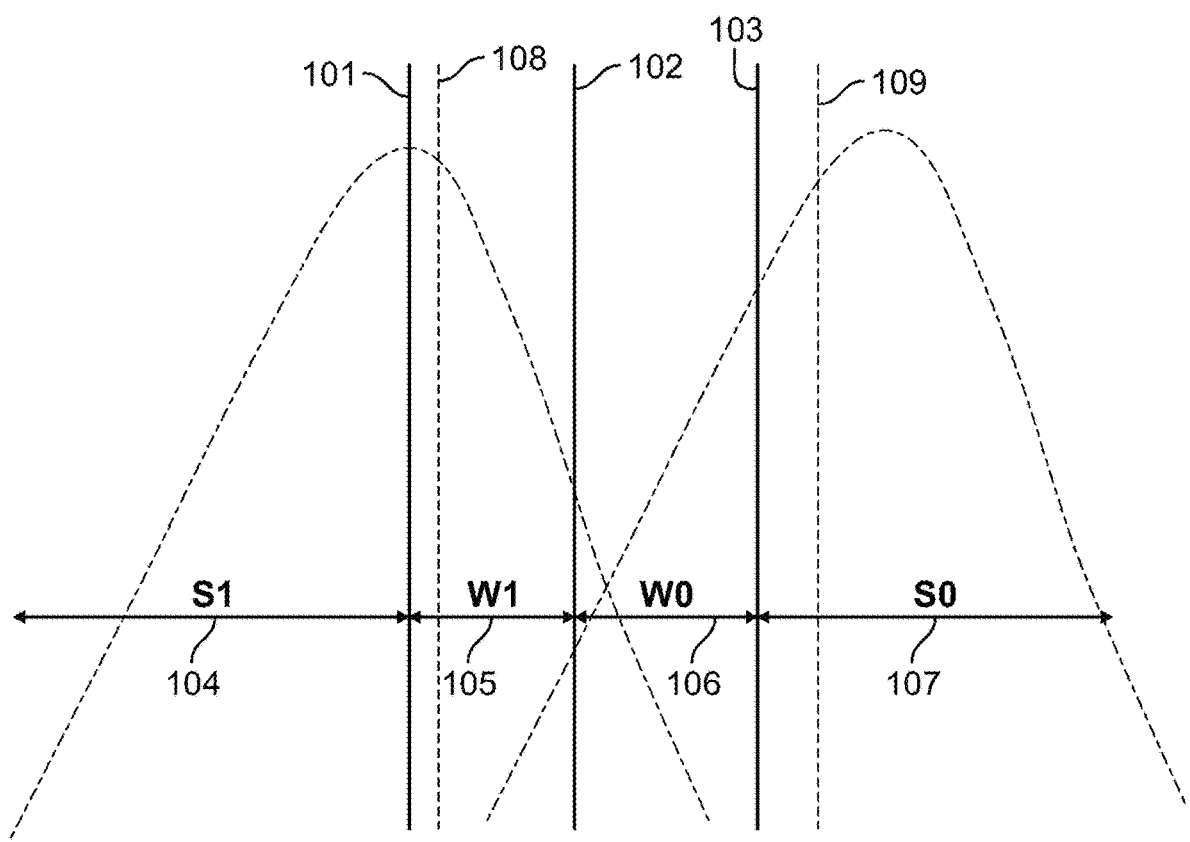
FIG. 1 depicts how hard threshold and soft threshold offsets are utilized in a deep retry operation.

As noted above, data is read from NAND Flash memory by using a read reference threshold voltage, which may or may not have the proper value, possibly leading to decoding failure.

Typically, when a decoding failure occurs while reading from NAND Flash memory, a read retry process is invoked. In the read retry process, decoding is attempted using a new read reference threshold voltage read from an RRT provided by the NAND manufacturer. Decoding may succeed using one of the RRT entries as the threshold voltage, or decoding may fail even after trying all of the RRT entries. If decoding fails after trying all of the entries in the RRT, a deep retry operation may be used in further decoding attempts.

Each time a deep retry operation is invoked and the soft thresholds are utilized, a determination is made to confirm whether the decoding was successful. According to an implementation of the subject matter of this disclosure, this determination of whether the decoding was successful may be made using a parity check. The parity check employed to determine whether coding was successful may use a parity check matrix, where each row of the matrix corresponds to a single parity check and the number of unsatisfied parity checks form the syndrome weight. According to another implementation of the subject matter of this disclosure, a low density parity check code may be used to determine whether decoding was successful, however, the subject matter of this disclosure is not limited thereto.

While initial decoding attempts and RRT-based retries use hard thresholds, a deep retry operation may use additional soft thresholds in an attempt to broaden out the signal levels indicative of a bit value. Typical deep retry techniques assume optimal placement of the hard threshold and soft thresholds relative to the signal levels. However, hard threshold placement may not be optimal leading to the errors that resulted in the decoding failure. There may be an instance where the errors resulting in decoding failure incorporate a higher number of "0 to 1" errors, when compared to the number of "1 to 0" errors, or vice-versa.

Based on the state of the NAND Flash memory device, among other parameters, proper LLR values needed for the highest decoding performance may require an asymmetric profile. LLR may be defined as the relationship between the probability (P0) of a bit being '0' and the probability (P1) of a bit being '1':

$$LLR = L = \log\left(\frac{P_1}{P_0}\right)$$

$$P_1 + P_0 = 1$$

$$P_0 = \frac{1}{\left(1 + e^L\right)}$$

$$P_1 = \frac{e^L}{\left(1 + e^L\right)}$$

Such LLR values may be provided in LLR tables, which may be a collection of sets of LLRs of varying values and symmetries that may be used to during deep retry operations. LLR tables may be predetermined (e.g., provided by a vendor). Alternatively, the LLR values may be derived using LLR techniques. In accordance with implementations of the subject matter of this disclosure, performance of a deep retry operation may be enhanced by using LLR values having diverse symmetries, meaning that some of the sets of LLR values may be symmetric and different sets of symmetric LLR values may have different symmetry profiles, and some sets of LLR values may be asymmetric and different sets of asymmetric LLR values may have different asymmetry profiles. Successful decoding in the deep retry process may be achieved using proper LLR values, which may have an asymmetric profile. The profile of asymmetry of these proper LLR values may depend upon the state of the NAND Flash memory device, among other parameters. to summarize, in some implementations, the LLR entries may be provided in an LLR table, while in others of those implementations, LLR sets with diverse symmetries may be generated using an adaptive technique.

The subject matter of this disclosure may be better understood by reference to FIGS. 1-10.

FIG. 1 depicts how hard threshold and soft threshold offsets are utilized in a deep retry operation.

To perform a deep retry operation, a total of "n" thresholds are utilized. Typically, these "n" thresholds are placed along the voltage levels of a cell. According to an implementation, the cell may be a two-bit cell and may store four values. The "n" thresholds divide the values stored by the cell, thereby creating "n+1" bins, the values of each of which is defined by the placement of the "n" thresholds. The "n" thresholds may include a hard threshold, as well as soft thresholds. The value of each of these "n+1" bins is mapped to an LLR value. Although the implementation of FIG. 1 depicts thresholds for a 3-level read, a higher number of levels may be used.

The four bin values shown in FIG. 1 as "Strong-1" (S1) bin 104, "Weak-1" (W1) bin 105, "Weak-0" (W0) bin 106 and "Strong-C" (S0) bin 107, are defined by the three thresholds 101, 102, 103. As described above, typically, deep retry techniques assume an optimal placement of soft thresholds 101, 103 and the hard threshold 102. Based on this, typically, the LLR values would be assumed to be symmetric in nature, and may be as follows: −12, −4, +4 and +12, with the S1 bin assigned a value of −12, the W1 bin assigned a value of −4, the W0 bin assigned a value of +4, and the S0 bin assigned a value of +12.

However, symmetric LLR values may not lead to the best performance in the deep retry operation, because the errors that resulted in the decoding failure may not be symmetrical, which may be the reason that decoding failed in the first place. For example, the errors resulting in decoding failure may incorporate a higher number of "0 to 1" errors, when compared to the number of "1 to 0" errors.

In accordance with implementations of the subject matter of this disclosure, decoder performance may be improved by using asymmetric LLR values. Although two soft thresholds (in addition to the one hard threshold) are shown in FIG. 1, defining (with the hard threshold) four bins, which are mapped to four LLR values, the number of LLRs in an entry of the LLR table may differ depending on the number of thresholds to be placed and the number of cell levels, which determines the number of bins.

According to an implementation of the subject matter of this disclosure, based on the illustration depicted in FIG. 1, alternate placement of soft thresholds 108, 109 may be assumed. Accordingly, LLR values in the LLR table may be completely asymmetric having different asymmetry profiles as follows:

[−12, −3, 5, 14]
[−10, −2, 4, 12]
[−12, −5, 1, 7]
[−12, −2, 2, 10]

According to another implementation, the multiple LLR entries may be symmetric but may display different symmetry profiles as follows:

[−12, −3, 3, 12]
[−10, −2, 2, 10]
[−9, −1, 1, 9]
[−14, −5, 5, 14]

The deep retry operation runs the soft decoder with the first LLR entry from the set of four entries as shown above. If the process still fails to achieve successful decoding, the soft decoder uses the second LLR entry from the set of four LLR entries at the same read level. This process may be continued with all the entries of the LLR table until a successful decoding result is achieved or until all entries in the LLR table are exhausted.

In the implementations described so far, LLR tables are used. According to such implementation of the subject matter of this disclosure, a first (possibly asymmetric) LLR entry from the LLR table is used to perform the deep retry operation and if that first entry fails, the second (possibly asymmetric) entry from the LLR table is used instead of moving on to the next read level.

In other implementations of the subject matter of this disclosure, instead of reading the LLRs from a predefined LLR table, an adaptive LLR generation process may be used to generate the LLR entries of diverse symmetry based on performance statistics gathered during the failed hard decoding process. According to an implementation, the performance statistics used in the generation of the LLR entries may include, but are not limited to, an initial and final syndrome weights, 0-to-1 flips made by the hard decoder, and 1-to-0 flips made by the hard decoder. The adaptive LLR generation process may rely on a linear regression model, or may be executed using a neural network, as described in more detail below.

According to linear-regression-based implementations of the subject matter of this disclosure, a linear regression model may determine the LLRs using initial and final syndrome weights (SWin and SWfin respectively) as well as 0-to-1 flips made by the hard decoder (FOl) and 1-to-0 flips made by the hard decoder (F10). The ratio of the number of ones to the number of zeros in the corrupted codeword (R) also may be used. According to such an implementation of the subject matter of this disclosure, the LLRs may be derived adaptively as follows:

$$LLR0 = A0 \times SWIn + B0 \times SWfIn + C0 \times F01 + D0 \times F10 + E0 \times R$$

$$LLR1 = A1 \times SWIn + B1 \times SWfIn + C1 \times F01 + D1 \times F10 + E1 \times R$$

where An, Bn, Cn, Dn, and En are preoptimized constants, according to an implementation of the subject matter of this disclosure, which may be optimized based on the condition or the type of Flash memory device.

According to other implementations of the subject matter of this disclosure, the LLRs may be derived by a linear regression using the initial and final syndrome weight (SWIn and SWfin respectively) as well as 0-to-1 flips made by the hard decoder (F01) and 1-to-0 flips made by the hard decoder (F10). The number of observations in each bin (MS0, MS1, MW0 and MW1) also may be used. According to such an implementation of the subject matter of this disclosure, the LLRs may be derived adaptively as follows:

$$LLRS_0 = A_{s0} \times SW_{In} + BS_0 \times SW_{fIn} + CS_0 \times F_{01} + D_{S0} \times F_{10} + E_{s0} \times M_{s0} + F_{s0} \times M_{s1} + G_{s0} \times M_{w0} + H_{s0} \times M_{W1}$$

$$LLRS1 = A_{s1} \times SW_{In} + BS_1 \times SW_{fIn} + CS_1 \times F_{01} + DS_1 \times F_{10} + E_{s1} \times M_{s0} + F_{s1} \times M_{s0} + Gs_1 \times M_{w0} + H_{s1} \times M_{W1}$$

$$LLW0 = A_{W0} \times SW_{In} + BW_0 \times SW_{fIn} + CW_0 \times F_{01} + DW_0 \times F_{10} + E_{W0} \times M_{s0} + F_{W0} \times M_{s1} + G_{W0} \times M_{w0} + H_{W0} \times M_{W1}$$

$$LLRW1 = A_{W1} \times SW_{In} + BW_1 \times SW_{fIn} + C_{W1} \times F_{01} + DW_1 \times F_{10} + E_{W1} \times M_{s0} + F_{W1} \times M_{s1} + G_{W1} \times M_{w0} + H_{W1} M_{W1}$$

where $A_n$, $B_n$, $C_n$, $D_n$, $E_n$, $F_n$, $G_n$ and $H_n$ are preoptimized constants, which may be optimized based on the condition or the type of Flash memory device.

According to other implementations of the subject matter of this disclosure, different combinations of decoder statistics, and different numbers of preoptimized constants may be used.

According to other implementations of the subject matter of this disclosure, a neural network may be used to adaptively derive the LLRs technique based on, e.g., initial and final syndrome weight, 0-to-1 flips made by the hard decoder and 1-to-0 flips made by the hard decoder, as well as other decoder statistics, as described above in connection with linear regression implementations. The neural network used to perform the adaptive LLR technique may include an input layer, at least one hidden layer and an output layer The hidden layer or layers of the neural network process the input data with one or more activation functions to produce a set of LLR entries for use in the deep retry operation.

Although the implementations described above derive LLRs to set thresholds for a 3-level read, a higher number of read levels may be used. In such cases, each LLR entry will include more LLR values.

A plurality of approaches may be applied to perform the deep retry operation described above. In addition to implementations based on predetermined tables of asymmetric LLRs and implementations in which the asymmetric LLRs are adaptively derived (using either linear regression or neural networks), hybrid approaches may be used as described in more detail below.

Figure 2:
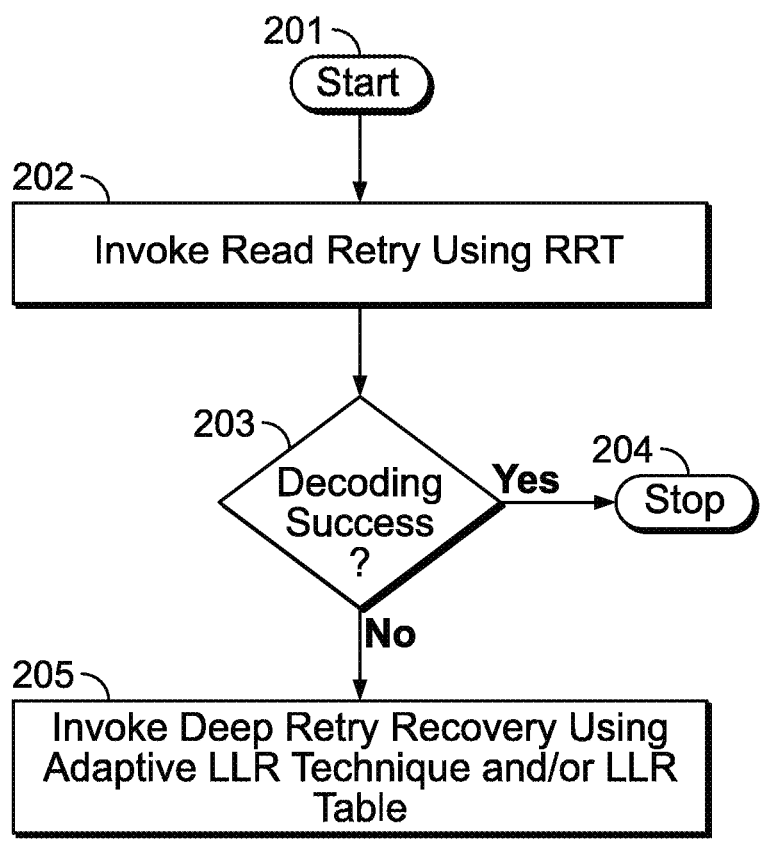
FIG. 2 is a flow diagram of a method according to an implementation of the subject matter of this disclosure.

FIG. 2 is a flow diagram of a method according to an implementation of the subject matter of this disclosure.

When a decoding failure occurs while reading from NAND Flash memory, a read retry process is invoked at 201. The read retry process begins at 202 with the first entry in an RRT and is continued till either a successful decoding result is achieved or all entries in the RRT are exhausted. Following the read retry operation, it is determined at 203 whether the decoding was successful, and if so, the process ends at 204.

However, if at 203 it is determined that the decoding was not successful, then a deep retry operation is invoked at 205. The deep retry operation may be performed using an LLR table or adaptive generation of LLR entries, or a combination of the two, as described in further detail below.

Figure 3:
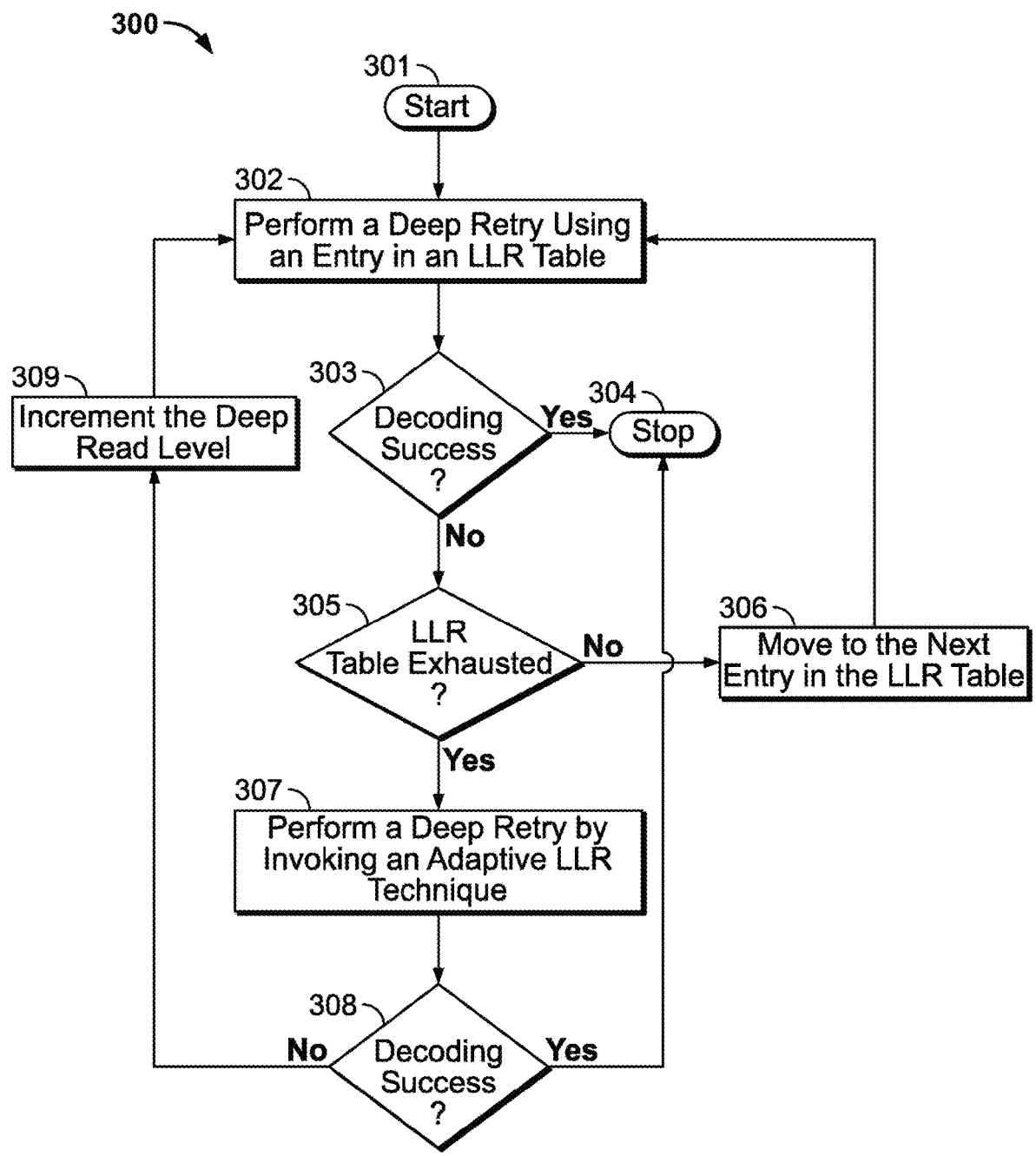
FIG. 3 is a flow diagram of a method for utilizing adaptive LLR techniques to perform decoding, according to an implementation of the subject matter of this disclosure.

FIG. 3 is a flow diagram of a first implementation 300 of a hybrid deep retry method according to the subject matter of this disclosure.

According to this implementation of the subject matter of this disclosure, process 300 begins a deep retry attempt at 301 using an LLR entry read from an LLR table at 302. At 303, it is determined whether decoding has been successful using the LLR entry from the LLR table. If the decoding has been successful, process 300 ends at 304. However, if it is determined at 303 that the decoding has not been successful, then at 305 it is determined whether all entries in the LLR table have been exhausted (i.e., each entry in the LLR table has been used to attempt the decoding). If at 305 it is determined that LLR table entries remain unused, then at 306 the next LLR entry in the LLR table is tried and the process is repeated until successful decoding or until all LLR table entries have been tried. However, if at 305 it is determined that all LLR entries in the LLR table have been tried and decoding has still failed, then at 307, an adaptive LLR technique is invoked. As described above, the adaptive LLR technique may rely on a linear regression or may be performed using a neural network, and the LLR entries that are generated are used to attempt decoding. At 308, it is determined whether the decoding using the adaptively-derived LLRs has been successful. If the decoding has been successful, process 300 ends at 304. However, if it is determined at 308 that the decoding technique using the adaptively-derived LLRs has not been successful, then at 309 process 300 is attempted at a higher number of reads (e.g., if the deep retry has been attempted using 3-level reads, further attempts may be made using 5-level reads, 7-level reads, etc.).

According to other implementations of the subject matter of this disclosure, instead of using all entries in the LLR table before trying to adaptively derive the LLRs, the LLRs may be adaptively derived after each unsuccessful attempt that is based on an entry in the LLR table, as described in connection with FIG. 4.

According to this implementation of the subject matter of this disclosure, process 400 begins a deep retry attempt at 401, invoking adaptive LLR derivation at 402. As described above, the LLRs may be adaptively derived using a linear regression function or a neural network. At 403, it is determined whether decoding, using the adaptively-derived LLRs has been successful. If the decoding has been successful, process 400 ends at 404. However, if at 403 it is determined that the decoding has not been successful, then at 405 a further decoding attempt is made using LLR entries from an LLR table. At 406, it is determined whether the decoding was successful. If decoding was successful, process 400 ends at 404. However, if at 406 it is determined that decoding was not successful, then at 407 it is determined whether all LLR table entries have been used (i.e., whether a decoding attempt has been made using each entry in the LLR table). If LLR table entries remain unused, then at 408 the next LLR entry in the LLR table is used to repeat the decoding attempt, returning to 405. However, if at 407 it is determined that all LLR entries in the LLR table have been tried and decoding has still failed, then at 409 process 400 is attempted at a higher number of reads (e.g., if the deep retry has been attempted using 3-level reads, further attempts may be made using 5-level reads, 7-level reads, etc.).

Figure 5:
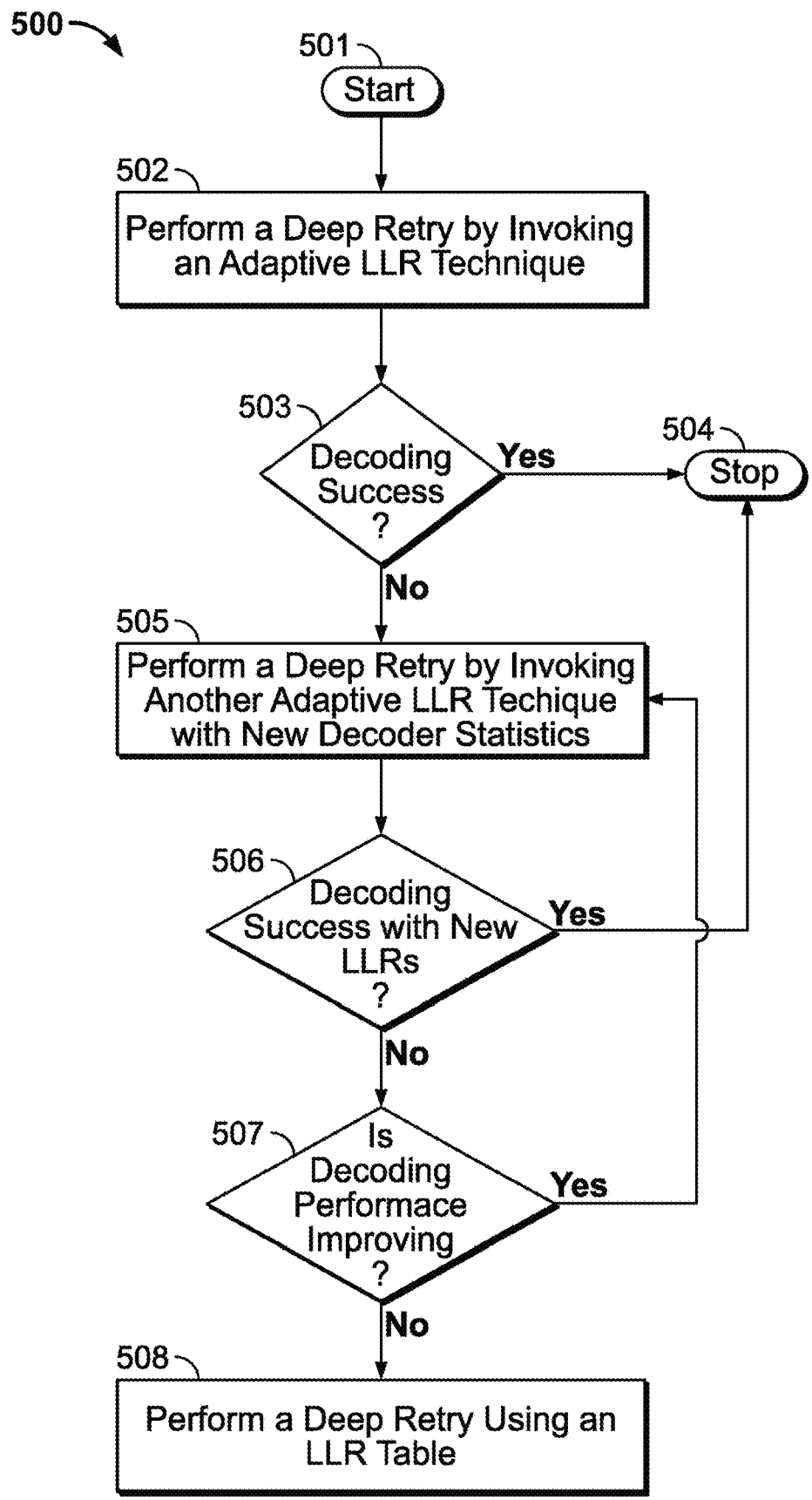
FIG. 5 is a flow diagram of a method for utilizing adaptive LLR techniques to perform decoding, according to a third implementation of the subject matter of this disclosure.

FIG. 5 is a flow diagram of a method for utilizing adaptive LLR techniques to perform decoding, according to a further implementation 500 of the subject matter of this disclosure.

Process 500 begins a deep retry attempt at 501 by invoking an adaptive LLR generation technique 502. As described above, the adaptive LLR adaptation technique may be based on a linear regression or a neural network, to generate LLRs for use in a deep retry operation. At 503, it is determined whether decoding has been successful using the adaptively-derived LLRs. If the decoding has been successful, process 500 ends at 504. However, if at 503 it is determined that the decoding has not been successful, then at 505 a further attempt to adaptively generate LLR entries is made at 505 with different decoder statistics. The different decoder statistics may be statistics recorded during the read retry process using each entry in the RRT. The different decoder statistics may also be the statistics recorded during previously failed deep retry attempts performed using the adaptive LLR generation technique 502. The decoder statistics may include, but are not limited to, an initial and final syndrome weights, 0-to-1 flips made by the hard decoder, and 1-to-0 flips made by the hard decoder. The new LLRs are used to perform the deep retry operation.

At 506, it is determined whether decoding was successful using the newly-derived LLRs. If so, process 500 ends at 504. However, if it is determined at 506 that decoding still was not successful, then at 507 it is determined whether the decoding performance is at least improving. For example, improved performance may be indicated by decreases in the output syndrome weight. If at 507 it is determined that the performance is improving, another attempt to adaptively generate LLRs invoked and deep retry recovery is again attempted, returning to 505. However, if at 507 it is determined that performance is not improving, then at 508 the deep retry operation continues using entries from an LLR table.

If decoding continues to fail using LLRs from the LLR table, then at 509 process 500 is attempted at a higher number of reads (e.g., if the deep retry has been attempted using 3-level reads, further attempts may be made using 5-level reads, 7-level reads, etc.).

Figure 4:
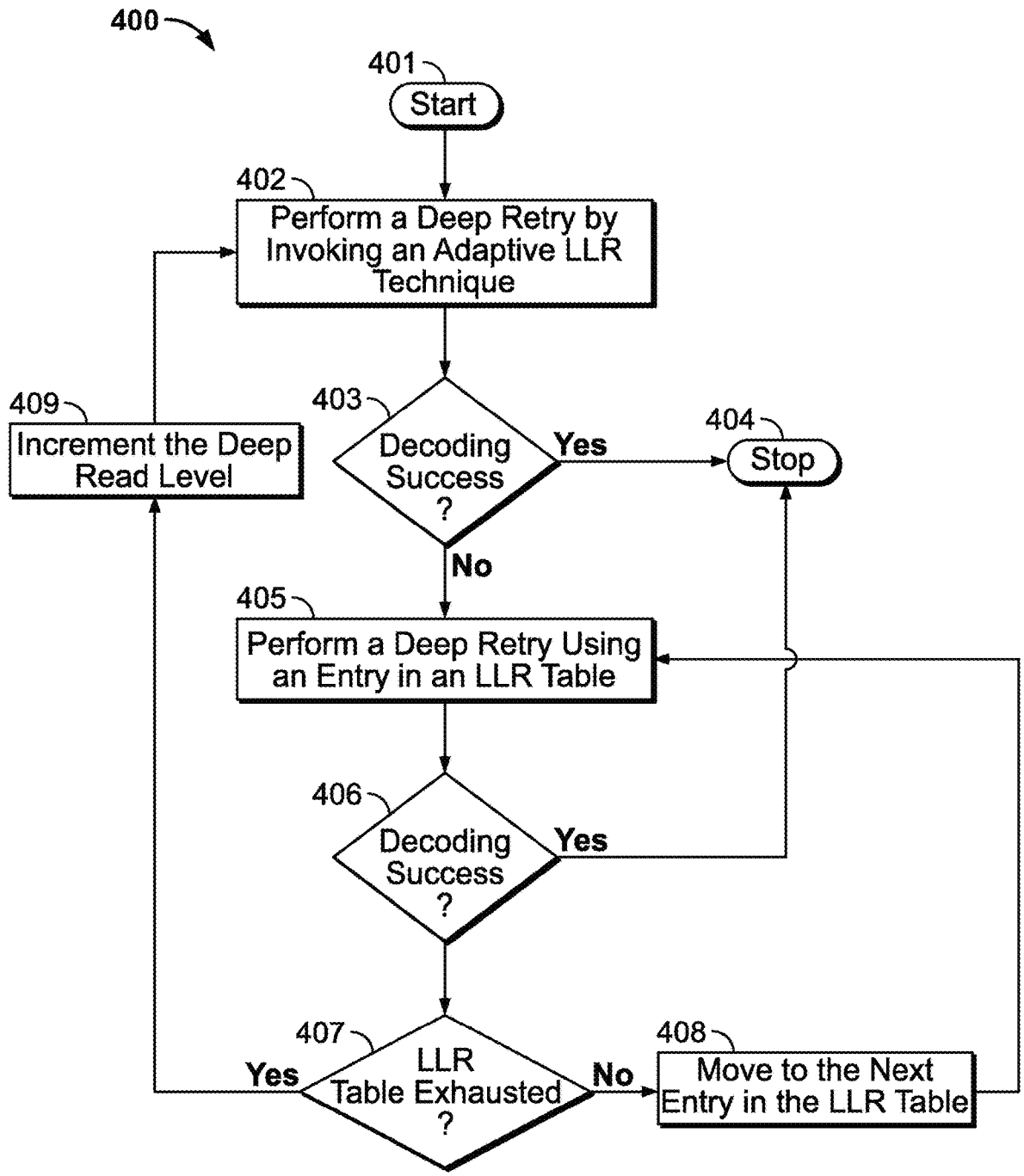
FIG. 4 is a flow diagram of a method for utilizing adaptive LLR techniques to perform decoding, according to a second implementation of the subject matter of this disclosure.

Although the hybrid implementations of FIGS. 3-5 are described as invoking various LLR generation techniques (including table look-up) in particular orders, the subject matter of this disclosure is not limited to any particular order of the various LLR generation techniques.

Figure 6:
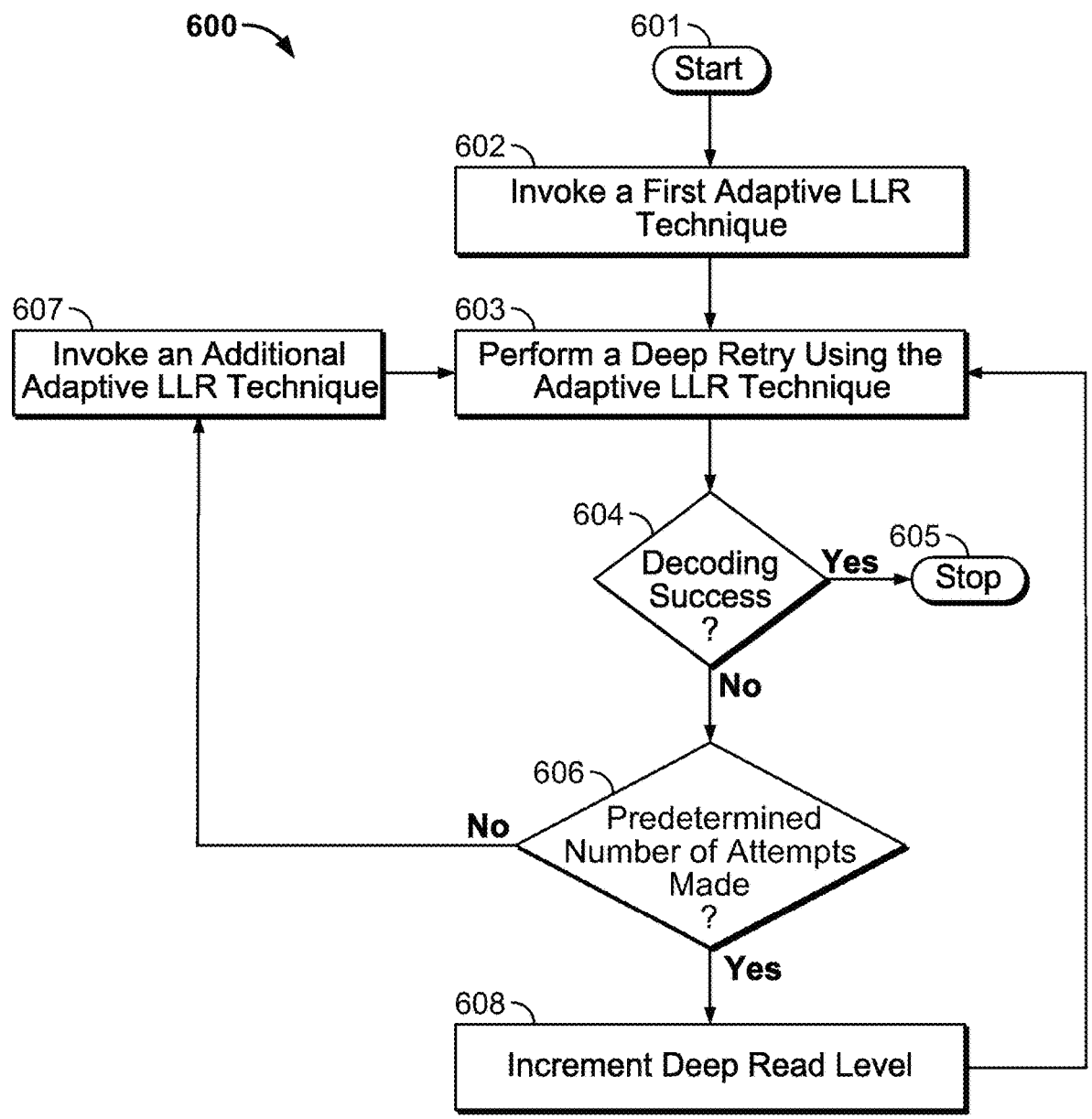
FIG. 6 is a flow diagram of a method for utilizing adaptive LLR techniques to perform decoding, according to a fourth implementation of the subject matter of this disclosure.

According to another implementation of the subject matter of this disclosure, an adaptive LLR generation technique may be used to generate asymmetric LLR entries without utilizing an LLR table, as described in the flow diagram of FIG. 6.

According to this implementation of the subject matter of this disclosure, the process 600 begins a deep retry attempt at 601 by invoking an adaptive LLR generation technique for a first of a predetermined number of times 602. At 603, decoding is attempted using the LLR entries generated at 602, and at 604 it is determined whether the decoding has been successful. If the decoding has been successful, process 600 ends at 605. However, if at 604 it is determined that the decoding has not been successful, then at 606 it is determined whether the predetermined number of attempts has been made and, if it has not, then at 607 another attempt is made to adaptively generate LLRs.

Each additional attempt to adaptively generate LLRs may be the same but use different parameters. The different parameters may include different decoder statistics recorded during the read retry process using each entry in the RRT. The different decoder statistics may also be the statistics recorded during previously failed deep retry attempts performed using the adaptive LLR generation technique 603. The decoder statistics may include, but are not limited to, an initial and final syndrome weights, 0-to-1 flips made by the hard decoder, and 1-to-0 flips made by the hard decoder. In the case of a linear regression, may use different preoptimized constants. If a neural network is used, a different machine learning model may be tried. After LLRs are generated at 607, the deep retry operation is attempted using the newly-generated LLRs, returning to 603. If decoding continues to fail using newly-generated LLRs, then at 608 process 600 is attempted at a higher number of reads (e.g., if the deep retry has been attempted using 3-level reads, further attempts may be made using 5-level reads, 7-level reads, etc.).

Figure 7:
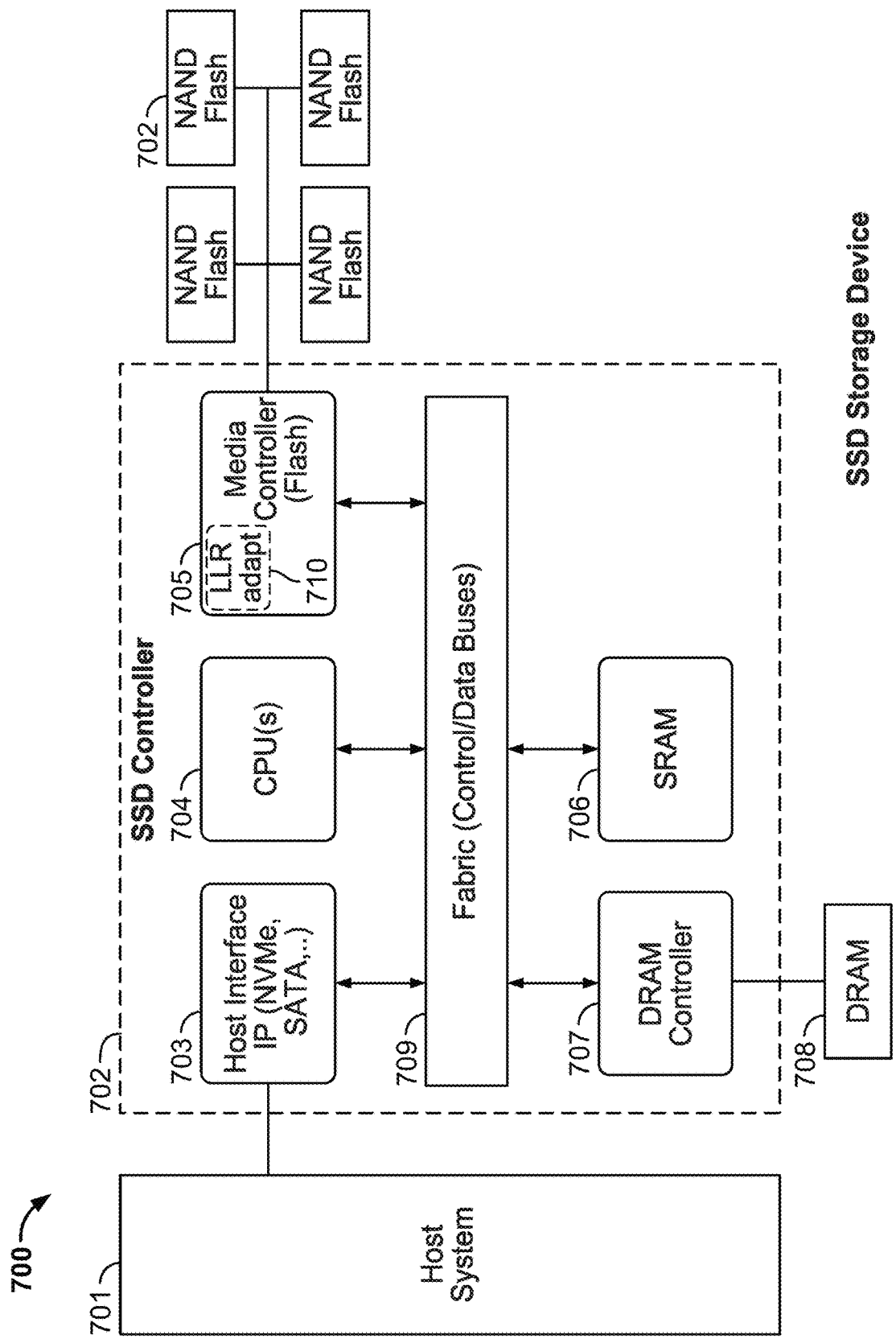
FIG. 7 is a block diagram of a solid-state drive (SSD) unit including controller circuitry incorporating an LLR adaptive engine within its Flash memory media controller, according to an implementation of the subject matter of this disclosure.

FIG. 7 is a block diagram of a first implementation of circuitry 700 for performing methods according to an implementation of the subject matter of this disclosure.

Circuitry 700 may be a controller for an SSD based on Flash memory devices, for interfacing with a host system 701. The storage medium of the SSD may be a set of NAND Flash memory devices 702, having a Flash memory media controller 705. SSD controller 700 may further include a host interface 703 for communicating with host 701, a central processing unit (CPU) 704, a dynamic random access memory (DRAM) 708, a DRAM controller 707, a static random access memory (SRAM) 706, and a data bus 709. Hard-wired adaptive LLR circuitry 710 may be implemented within the Flash media controller 705 to generate LLRs using adaptive LLR techniques described above. This allows the adaptive LLR circuitry 710 to sit directly adjacent to an error correction unit (e.g., an LDPC decoder) housing within the Flash media controller 705, which reduces the latency by avoiding the need to send the generated LLR entries through the data bus 709.

Figure 8:
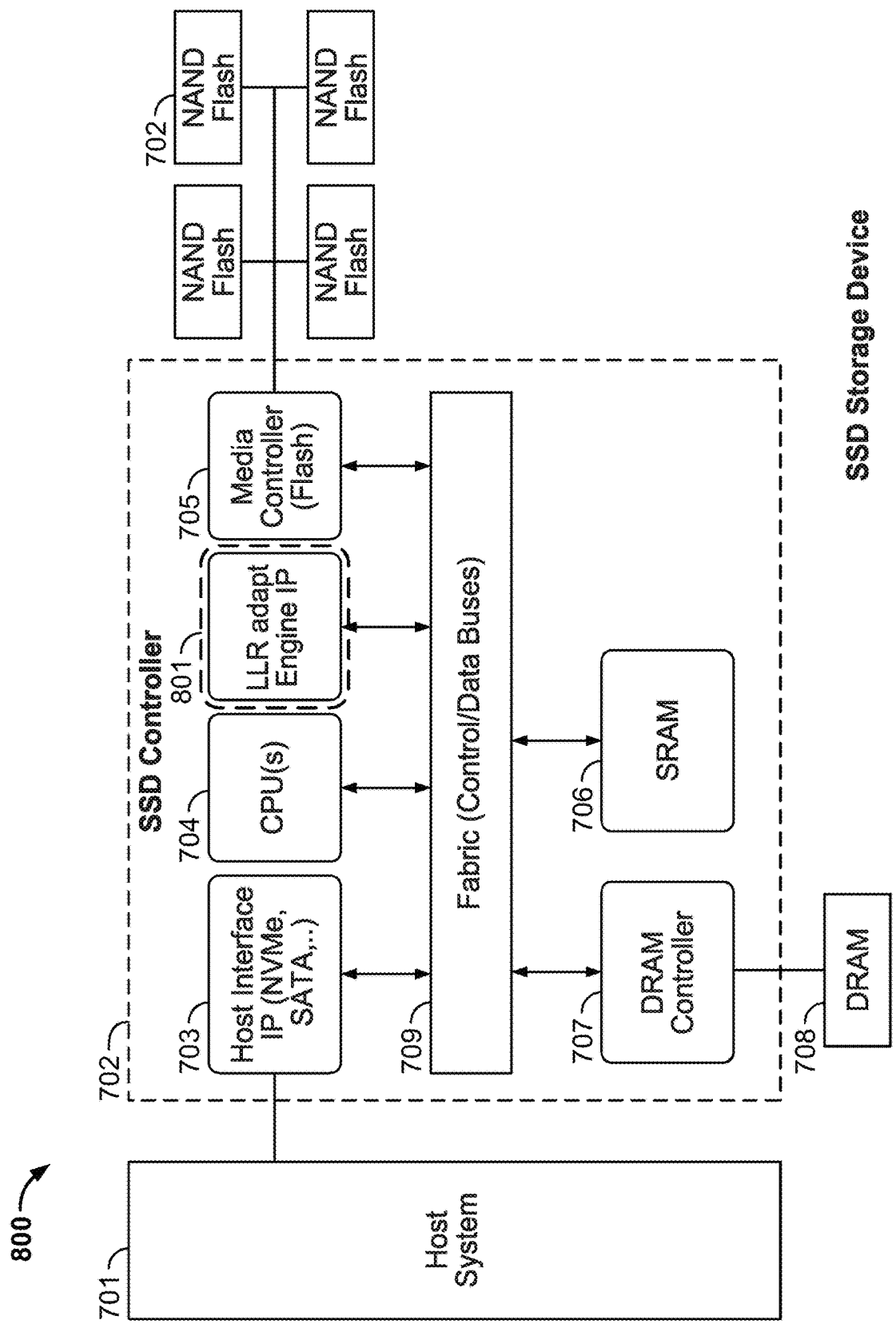
FIG. 8 is a block diagram of an SSD unit including controller circuitry incorporating an LLR adaptive engine external to the Flash memory media controller, according to an implementation of the subject matter of this disclosure.

FIG. 8 is a block diagram of an SSD controller 800, similar to SSD controller 700 and again sitting between a Flash memory storage medium of the SSD and a host system 701. According to this implementation, rather than being included in the Flash memory media controller 705, a separate hard-wired LLR adaptive engine circuitry 801 may be included in SSD controller 800 adjacent Flash memory media controller 705. This achieves most of the advantages of having the LLR adaptive engine circuitry adjacent to the error correction circuitry, without having to alter Flash memory media controller 705.

Figure 9:
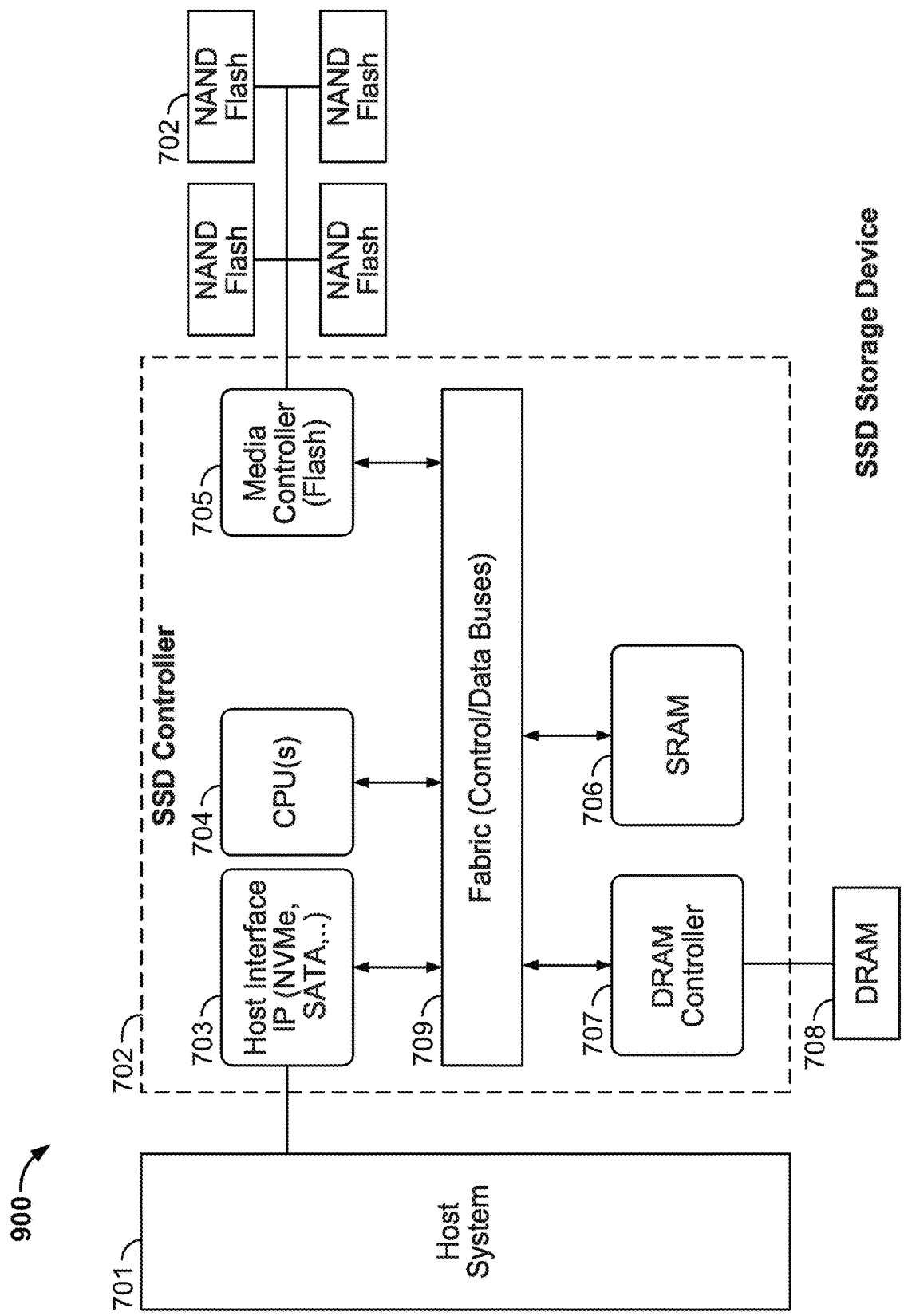
FIG. 9 is a block diagram of an SSD unit including controller circuitry that executes an LLR adaptive engine within its processing unit, according to an implementation of the subject matter of this disclosure.

FIG. 9 is a block diagram of an SSD controller 900, similar to SSD controllers 700, 800 and again sitting between a Flash memory storage medium of the SSD and a host system 701. According to this implementation, the adaptive LLR technique may be incorporated in a firmware script that may be stored in SRAM 706. CPU 704 may read the firmware script from SRAM 706 via the data bus 709. Alternatively, the firmware script may be stored and transmitted through the DRAM 708. In either alternative, the CPU 704 runs the firmware script to adaptively generate LLR entries as described above. Those LLR entries are transmitted to the Flash media controller 705 via the data bus 709. According to alternative implementations (not shown), the firmware script may be run by a microprocessor or a microcontroller.

Although the implementations of FIGS. 7-9 depict the adaptive LLR circuitry in the context of a Solid State Drive (SSD) controller where Flash memory serves the storage medium, the adaptive LLR circuitry may be used in connection with other implementations of a Flash memory controller.

Figure 10:
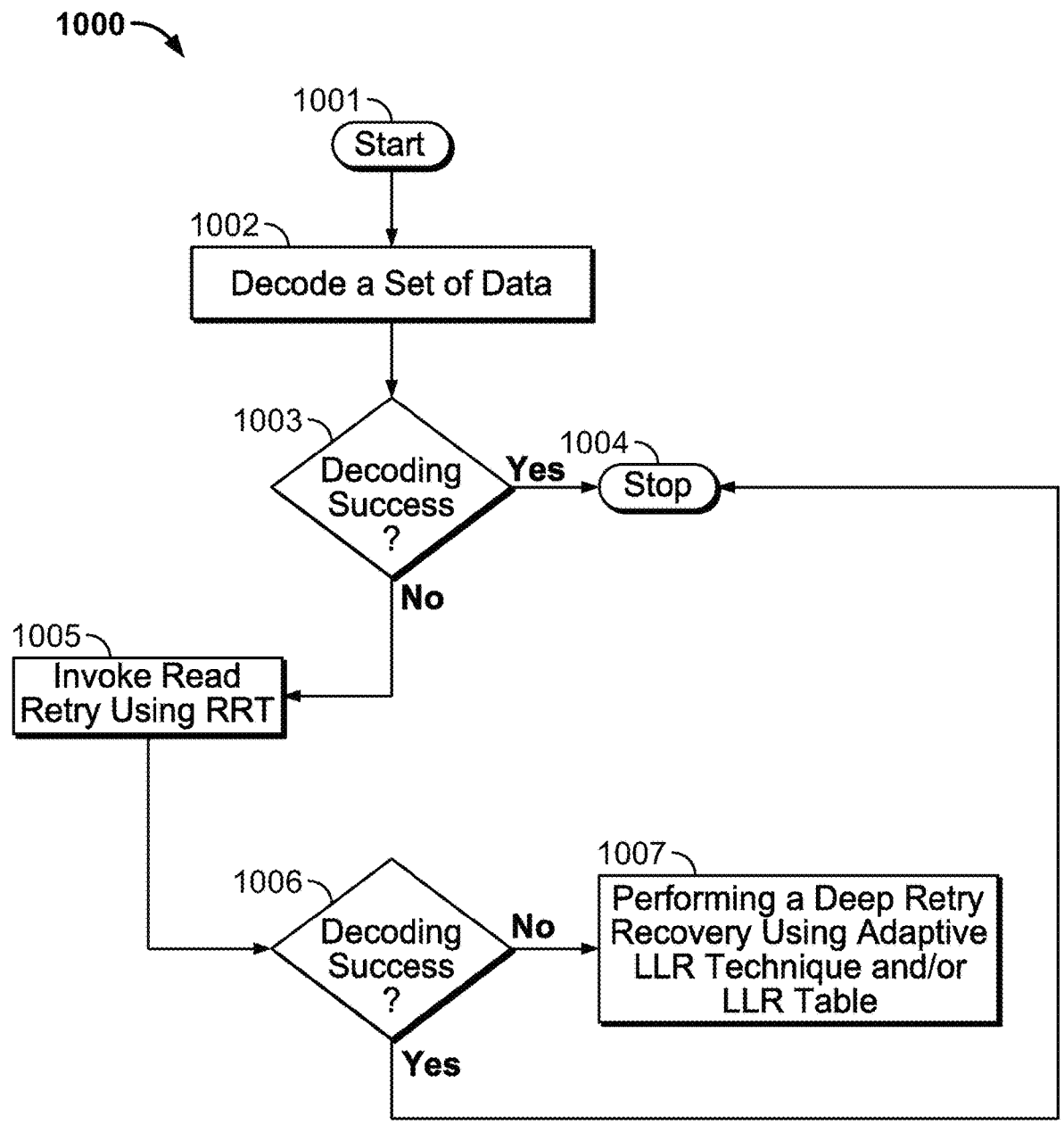
FIG. 10 is a flow diagram of a method according to another implementation of the subject matter of this disclosure.

FIG. 10 is a flow diagram broadly illustrating a method 1000 according to the subject matter of this disclosure. Method 1000 begins at 1001. At 1002, an initial attempt is made to decode a set of data. At 1003, it is determined whether the decoding at 1002 was successful. If the data was decoded successfully, method 1000 ends at 1004. However, if at 1003 it is determined that the decoding was unsuccessful, a read retry process is invoked at 1005. In the read retry process, decoding is attempted one or more times using new read reference threshold voltages read from an RRT provided by the NAND manufacturer until decoding succeeds or until all RRT entries are used without success. At 1006, it is them determined whether the read retry process (using some or all of the RRT entries) was successful in decoding the data. If the decoding was successful during the read retry process, then method 1000 ends at 1004. However, if at 1006 it is determined that the read retry process failed to perform the decoding, a deep retry operation as described above is invoked at 1007.

Thus it is seen that adaptively generating log-likelihood ratio (LLR) entries, based on soft information, for use in a deep retry operation on NAND Flash memory devices, has been provided.

As used herein and in the claims which follow, the construction "one of A and B" shall mean "A or B."

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A method of reading data read from a NAND Flash memory device, the method comprising:
    decoding a set of data read from the NAND Flash memory device, using an initial set of hard bit thresholds;
    when the decoding is unsuccessful, performing a read-retry operation that retries the decoding using, in order, each of a plurality of entries in a read-retry table of hard bit thresholds, stopping when decoding based on one of the entries is successful;
    when the read-retry operation is unsuccessful, performing a deep retry operation using a set of log-likelihood ratios (LLRs) that vary in at least one of (a) values, and (b) symmetries, the deep retry operation comprising:
        selecting a first operation for providing the set of LLRs that vary,
        performing the first operation and determining decoder statistics based on the first operation,
        in response to determining that the decoding performance is improving based on a change of the decoder statistics, continuing to use the first operation, and
        in response to the decoding performance not improving, selecting and performing a second operation for providing the set of LLRs that vary; and
    communicating the decoded data to a host.

2. The method of claim 1 wherein the set of LLRs that vary are derived from a predetermined table.

3. The method of claim 2, further comprising:
    when the set of LLRs that vary derived from the predetermined table has been exhausted without achieving successful reading,
    adaptively generating additional LLR values using an adaptive generation technique.

4. The method of claim 1 comprising generating the set of LLRs that vary using a first adaptive generation technique.

5. The method of claim 4, wherein the first adaptive generation technique is a linear regression process.

6. The method of claim 4 wherein the first adaptive generation technique is a machine learning technique.

7. The method of claim 6, wherein the first adaptive generation technique is performed using a neural network.

8. The method of claim 4, further comprising:
    when the adaptively generated set of LLRs that vary has been exhausted without achieving successful reading,
    adaptively generating additional LLR values using a second adaptive generation technique.

9. The method of claim 4, wherein the generating the set of LLRs that vary is based on a plurality of preoptimized constants.

10. The method of claim 4, wherein the generating the set of LLRs that vary is based on an initial and final syndrome weight.

11. The method of claim 4, wherein the generating the set of LLRs that vary is based on 0-to-1 flips and 1-to-0 flips made by a hard decoder.

12. The method of claim 4, further comprising:
    when the adaptively generated set of LLRs that vary has been exhausted without achieving successful reading, performing the deep retry operation using LLR values derived from a predetermined table.

13. The method of claim 4, further comprising:
    when the adaptively generated set of LLRs that vary has been exhausted without achieving successful reading, performing the deep retry operation using LLR values corresponding to a higher number of read levels.

14. The method of claim 1, wherein the decoder statistics comprise an output syndrome weight, and determining that the decoder performance is improving based on a change of the decoder statistics comprises determining that a value of the output syndrome weight decreased.

15. The method of claim 4, further comprising:
    when the adaptively generated set of LLRs that vary has been exhausted without achieving successful reading,
    adaptively generating additional LLR values using a second adaptive generation technique, wherein generating additional LLR values is limited to a predetermined number of additional LLR values.

16. A NAND Flash memory apparatus, comprising:
    a Flash media controller configured to decode data by:
        selecting a first operation for providing a set of LLRs that vary,
        performing the first operation and determining decoder statistics based on the first operation,
        in response to determining that a decoding performance is improving based on a change of the decoder statistics, continuing to use the first operation, and
        in response to the decoding performance not improving, selecting and performing a second operation for providing the set of LLRs that vary;
    a data bus;
    an adaptive log-likelihood ratio (LLR) engine circuit configured to generate, for use in a deep retry operation, the set of LLRs that vary in at least one of (a) values, and (b) symmetries, and to transfer the set of LLRs that vary to the Flash media controller via the data bus; and
    an interface configured to communicate the decoded data to a host.

17. The NAND Flash memory apparatus of claim 16, wherein the adaptive LLR engine circuit is embedded within the Flash media controller.

18. The NAND Flash memory apparatus of claim 16, further comprising:
    a static random access memory (SPAM); and
    at least one central processing unit (CPU); wherein:
    the SRAM is configured to transfer a firmware script to the at least one CPU via the data bus; and
    the at least one CPU is configured to run the firmware script to generate the set of LLRs that vary, and to transfer the set of LLRs that vary to the Flash media controller via the data bus.

19. The NAND Flash memory apparatus of claim 16, further comprising:
    a dynamic random access memory (DRAM); and
    at least one central processing unit (CPU); wherein:
    the DRAM is configured to transfer a firmware script to the at least one CPU via the data bus; and
    the at least one CPU is configured to run the firmware script to generate the set of LLRs that vary, and to transfer the set of LLRs that vary to the Flash media controller via the data bus.

20. The NAND Flash memory apparatus of claim 16, further comprising:
    at least one of a static random access memory (SRAM) and a dynamic random access memory (DRAM); and
    at least one of a microprocessor and a microcontroller; wherein:

the at least one of SRAM and DRAM is configured to transfer a firmware script to the at least one of the microprocessor and the microcontroller via the data bus; and the at least one of the microprocessor and the microcontroller is configured to run the firmware script to generate the set of LLRs that vary, and to transfer the set of LLRs that vary to the Flash media controller via the data bus.

21. The NAND Flash memory apparatus of claim 16, wherein the adaptive LLR engine circuit comprises linear regression circuitry.

22. The NAND Flash memory apparatus of claim 16, wherein the adaptive LLR engine circuit comprises a neural network.

* * * * *